US012683315B2

(12) United States Patent
Utz et al.

(10) Patent No.: US 12,683,315 B2
(45) Date of Patent: Jul. 14, 2026

(54) BUSBAR CABLE ADAPTER

(71) Applicant: Dell Products L.P., Round Rock, TX (US)

(72) Inventors: James Utz, Georgetown, TX (US); Corey Dean Hartman, Hutto, TX (US); Ben John Sy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 372 days.

(21) Appl. No.: 18/428,713

(22) Filed: Jan. 31, 2024

(65) Prior Publication Data

US 2025/0246839 A1 Jul. 31, 2025

(51) Int. Cl.
| | |
|---|---|
| *H01R 13/426* | (2006.01) |
| *H01R 13/627* | (2006.01) |
| *H05K 7/14* | (2006.01) |
| *H05K 7/20* | (2006.01) |

(52) U.S. Cl.
CPC ....... *H01R 13/426* (2013.01); *H01R 13/6275* (2013.01); *H05K 7/1489* (2013.01); *H05K 7/20654* (2013.01)

(58) Field of Classification Search
CPC .. H01R 13/426; H01R 13/6275; H01R 13/44; H01R 13/6392; H05K 7/1489; H05K 7/20654; H05K 7/1492
See application file for complete search history.

(56) References Cited

U.S. PATENT DOCUMENTS 10,951,013 B2 * 3/2021 Huang ..................... H02J 3/06

FOREIGN PATENT DOCUMENTS

| | | | | | |
|---|---|---|---|---|---|
| EP | 3539425 B1 | * | 10/2021 | ............ | F21V 21/096 |
| EP | 3982493 B1 | * | 12/2025 | ......... | H01R 13/6273 |
| GB | 2344700 A | * | 6/2000 | ......... | H01R 13/6335 |

* cited by examiner

*Primary Examiner* — Travis S Chambers
(74) *Attorney, Agent, or Firm* — Fogarty LLP

(57) ABSTRACT

A cable adapter for a server chassis is disclosed. The cable adapter comprises an adapter body having a first surface with a key slot. The key slot is configured to receive a key rib on a busbar clip of the server chassis. A pair of latches are pivotally attached to opposite sides of the adapter body. Each latch has a latch arm that extends across an open end of the adapter body when in a closed position. The latch arms are configured to engage one or more latching ribs on the blades of the busbar clip such as by hooking around the latching ribs. A pair of connectors inside the adapter body configured to engage blades of the busbar clip.

19 Claims, 8 Drawing Sheets

BUSBAR CABLE ADAPTER

BACKGROUND

An Information Handling System (IHS) generally processes, compiles, stores, and/or communicates information or data for business, personal, or other purposes. IHSs may include a variety of hardware and software components that are configured to process, store, and communicate information and may include one or more computer systems, data storage systems, and networking systems. As IHS hardware components, such as processors and memory, have increased in speed and power consumption, the amount of heat produced by such components during operation of an IHS has also increased. Often, the temperatures of IHS hardware components must be kept within a well-defined range in order to prevent overheating, instability, malfunction, and/or damage that would lead to a shortened component lifespan and lowered datacenter reliability. Accordingly, cooling systems are used in IHSs in order to remove heat that is generated by hardware components. In passive airflow cooling systems, cooling fans are used to force heated air away from a hardware component, and to ventilate heated air away from cooling fins or other heat dissipating structures of the component. In an active, liquid cooling system, a heat-exchanging cold plate is thermally coupled to an IHS component that is to be cooled, and a chilled fluid is passed through conduits internal to the cold plate in order to remove heat from that component. The heated liquid is then cooled and recirculated.

SUMMARY

Embodiments are directed to a cable adapter for a server chassis. The cable adapter comprises an adapter body having a first surface with a key slot. The key slot is configured to receive a key rib on a busbar clip of the server chassis. A pair of latches are pivotally attached to opposite sides of the adapter body. The latches are configured to move between an open position and a closed position. The pair of latches are spring-loaded to the closed position. Each latch has a latch arm that extends across an open end of the adapter body when in the closed position. The latch arms are configured to engage a feature of the server chassis. A pair of connectors inside the adapter body are exposed at the open end when the latches are in the open position. The connectors are configured to engage blades of the busbar clip. The feature of the server chassis may be one or more latching ribs on the blades of the busbar clip. The latch arms are configured to hook around the latching ribs. Alternatively, the feature of the server chassis may be one or more holes in a back surface of the server chassis where the latch arms are configured to hook on to the one or more holes.

The key rib may be located on a first blade of the busbar clip. The key rib may be located on a top surface of the first blade of the busbar clip. The first blade may be a high side voltage or positive polarity blade.

A first contact in the adapter body is configured to make an electrical connection to a first blade of the busbar clip when the cable adapter is connected to the server chassis. A second contact in the adapter body is configured to make an electrical connection to a second blade of the busbar clip when the cable adapter is connected to the server chassis. The first contact and the second contact are covered by the latch arms when the pair of latches are in the closed position.

BRIEF DESCRIPTION OF THE DRAWINGS

Figure 1:
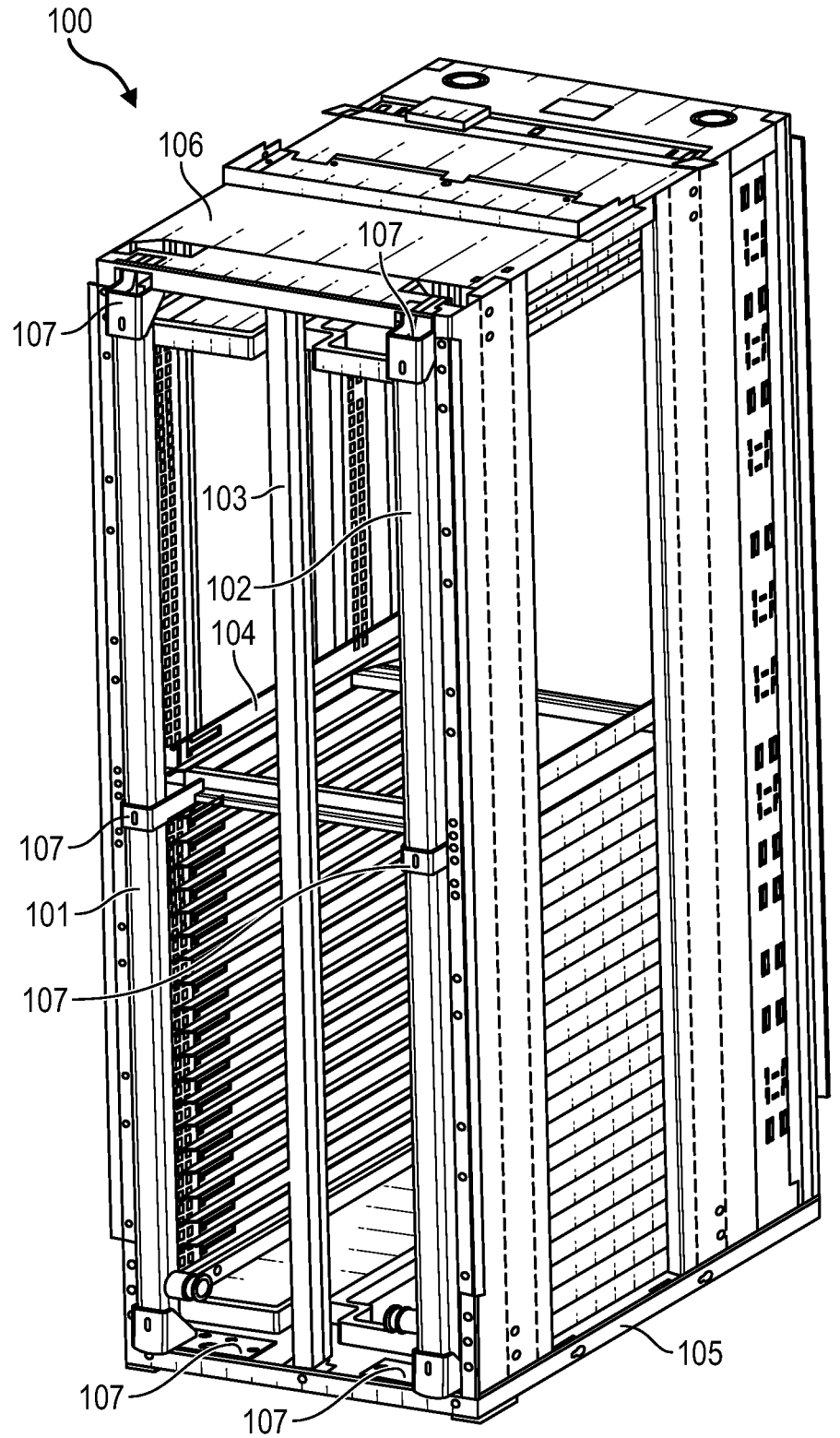

Having thus described the invention in general terms, reference will now be made to the accompanying drawings, which are not necessarily drawn to scale, and wherein:

FIG. 1 shows a computing rack that includes liquid cooling manifolds and a busbar according to embodiments.

Figure 2:
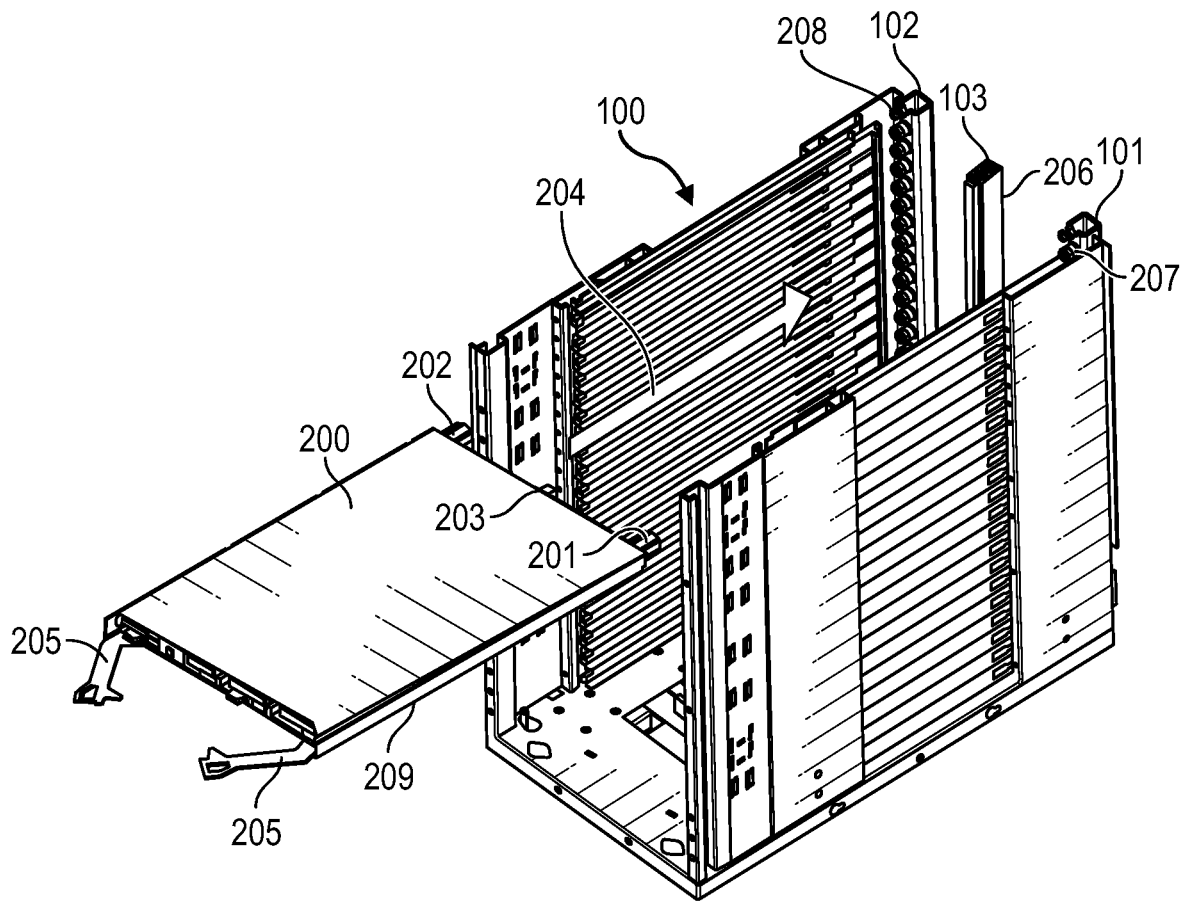

FIG. 2 is a front-view illustration of a server IHS being inserted into a slot of the computing rack shown in FIG. 1.

Figure 3:
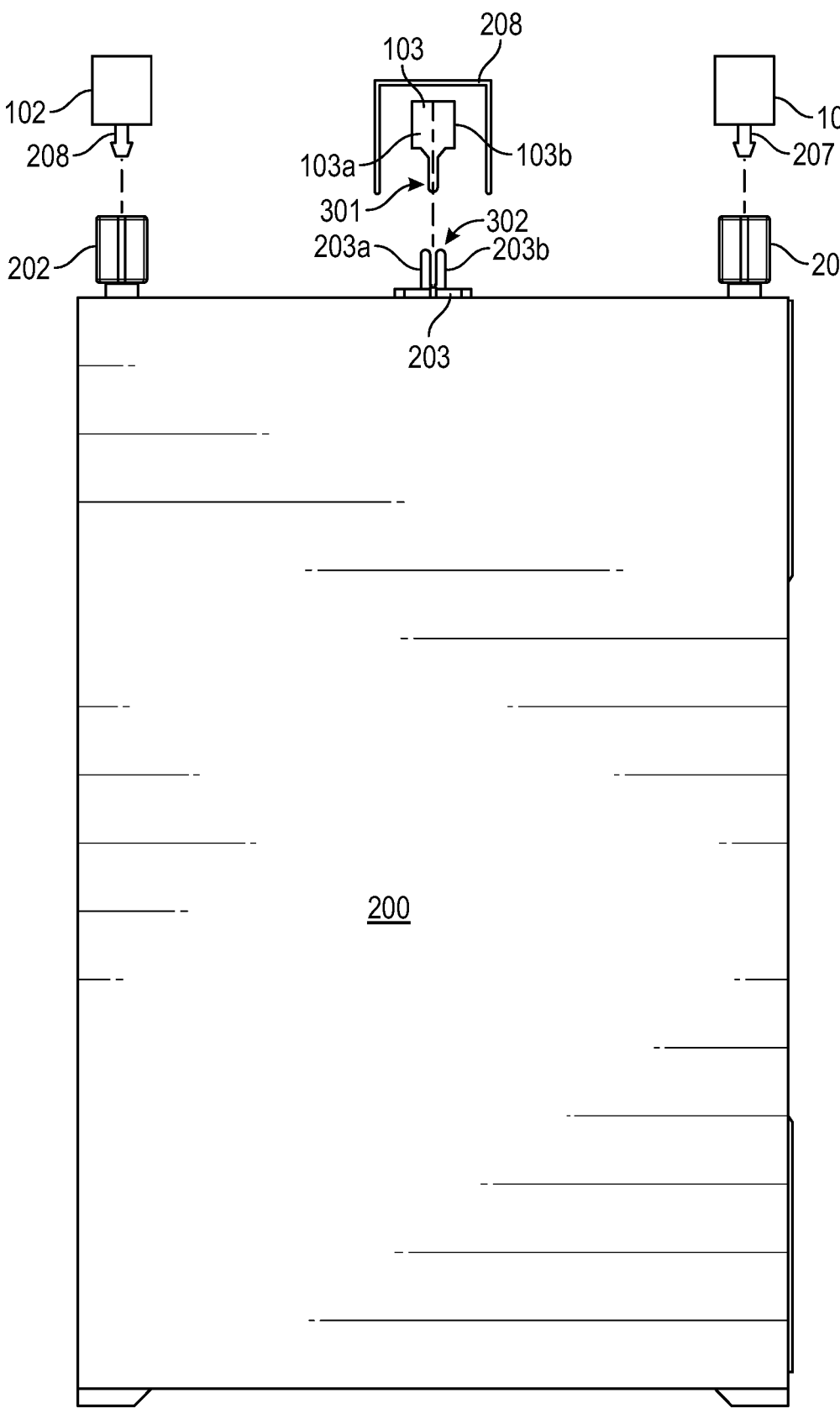

FIG. 3 is a top view of a server IHS 200 making power and cooling connections while being installed into the computing rack shown in FIG. 1.

Figure 4:
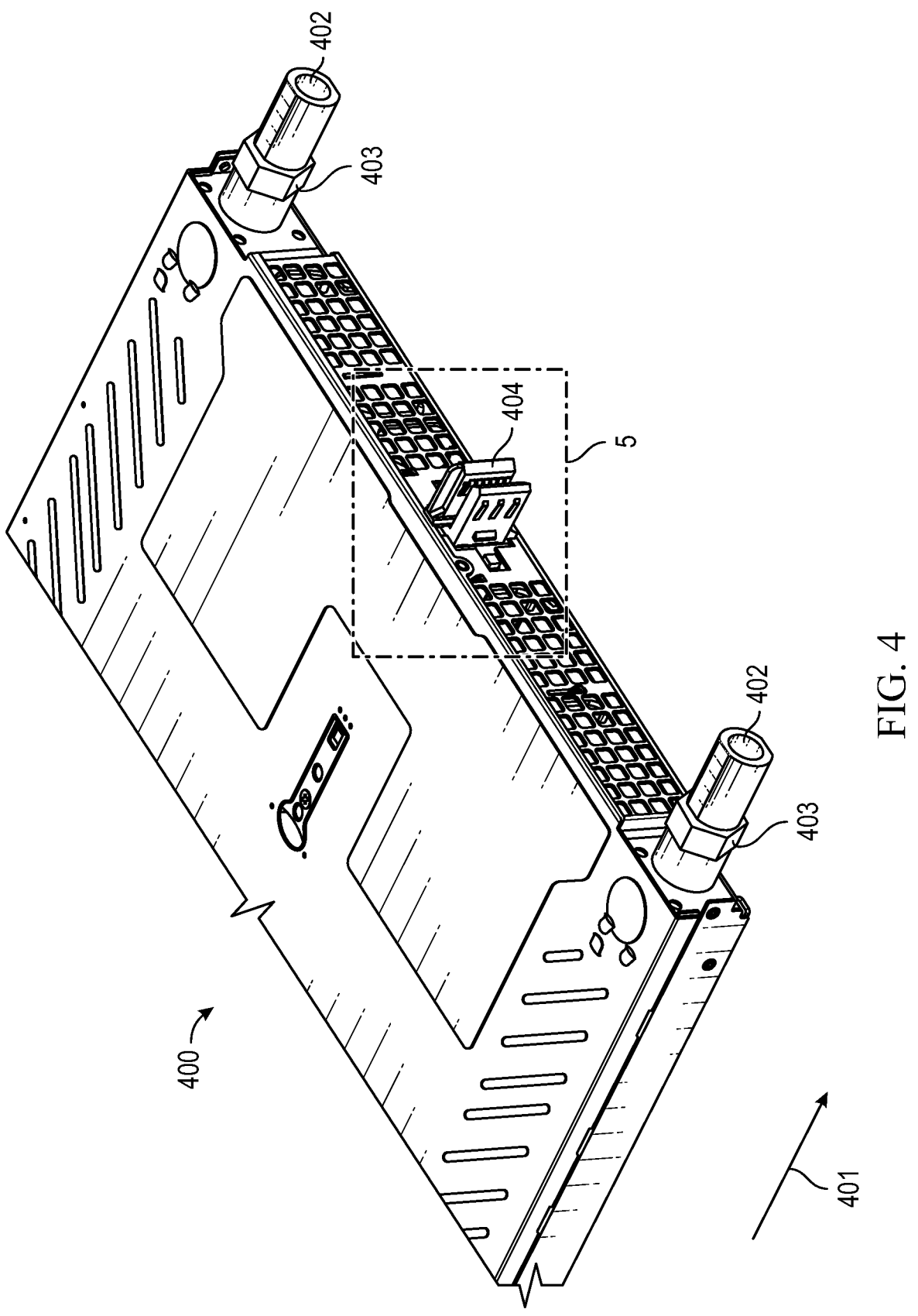

FIG. 4 is a partial top view from the rear of a server chassis that is adapted to fit in a computing rack.

Figure 5:
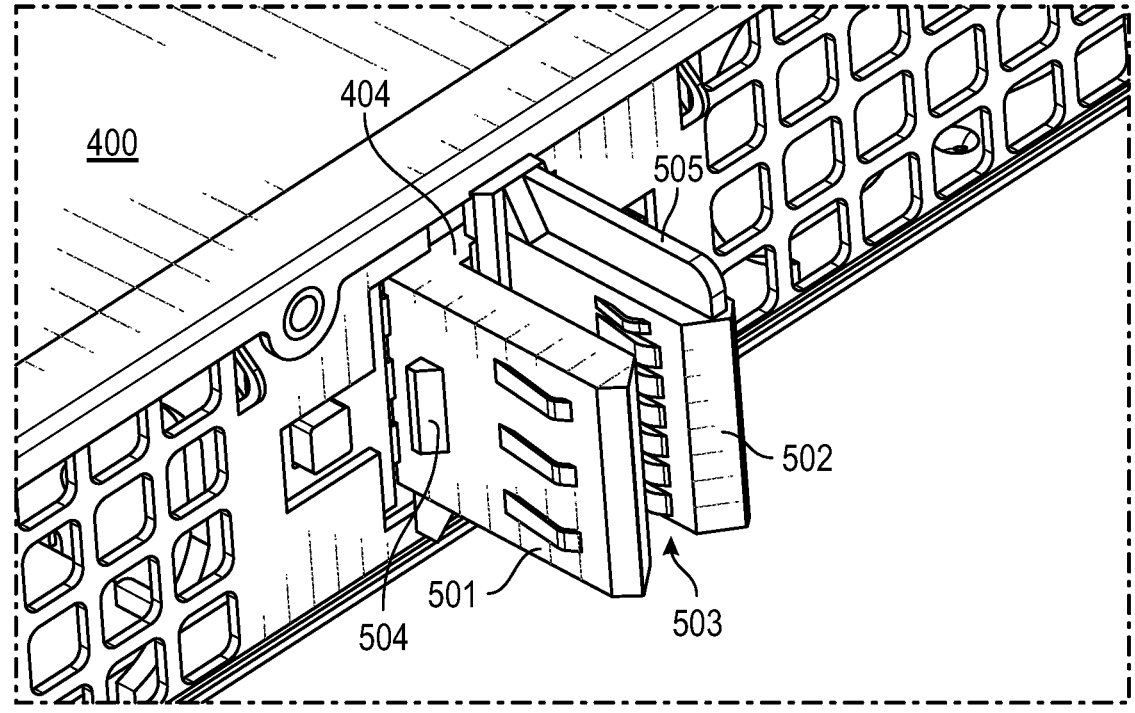

FIG. 5 is a close-up view of a busbar clip shown on a server chassis.

Figure 6:
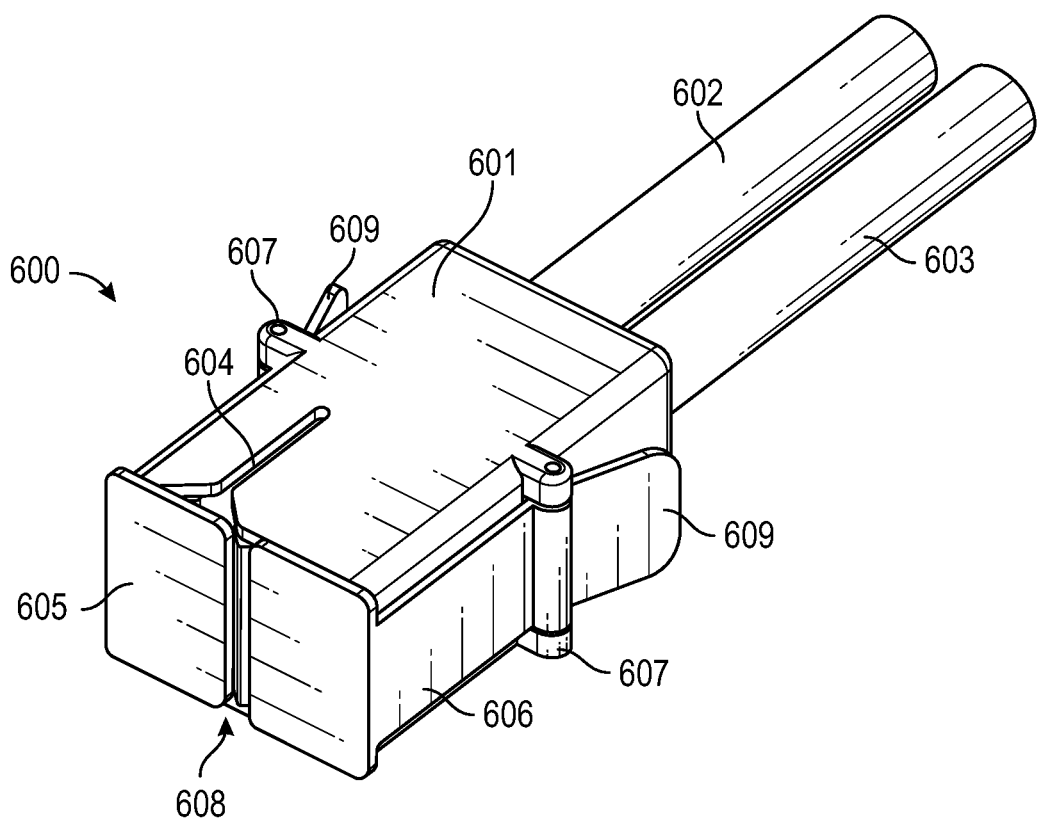

FIG. 6 illustrates a busbar cable adapter according to an example embodiment.

Figure 7:
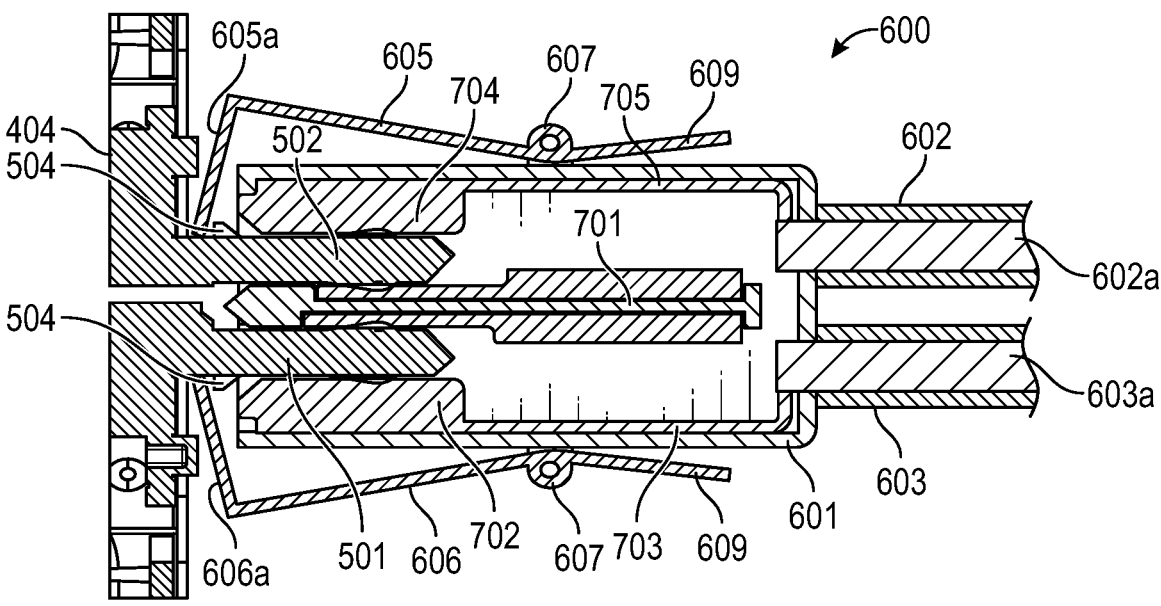

FIG. 7 is a top cross section view of an adapter connected to a busbar clip.

Figure 8:
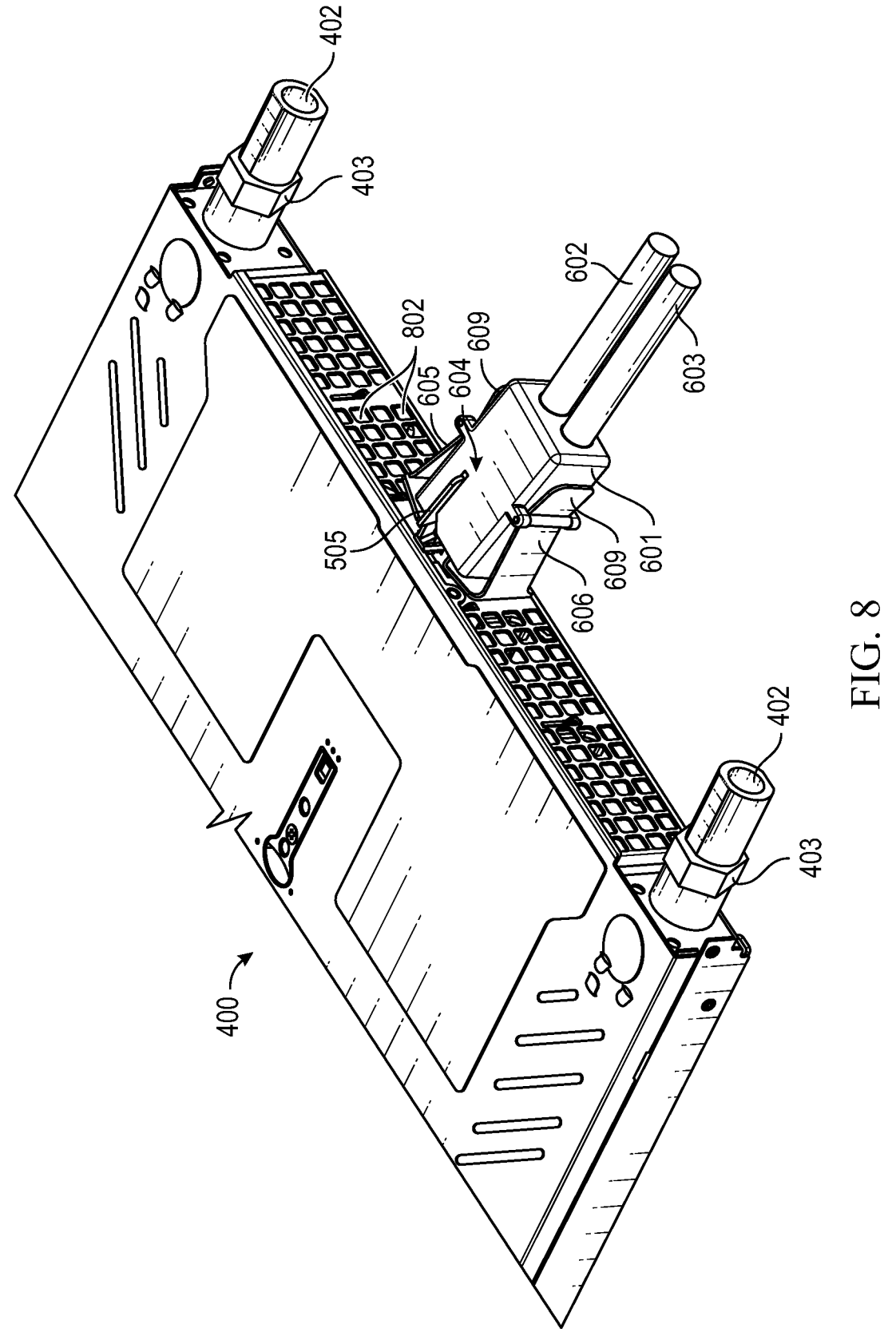

FIG. 8 illustrates a busbar cable adapter attached to a server chassis.

Figure 9:
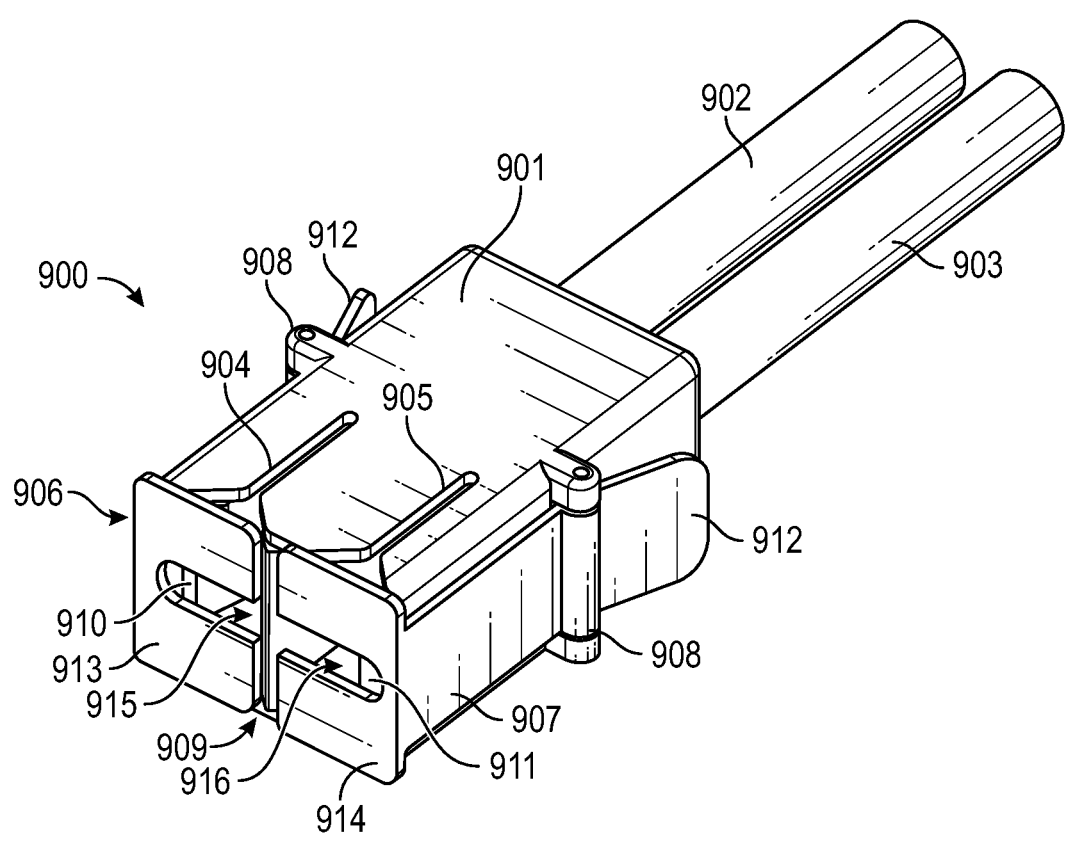

FIG. 9 illustrates another busbar cable adapter according to an alternative embodiment.

Figure 10:
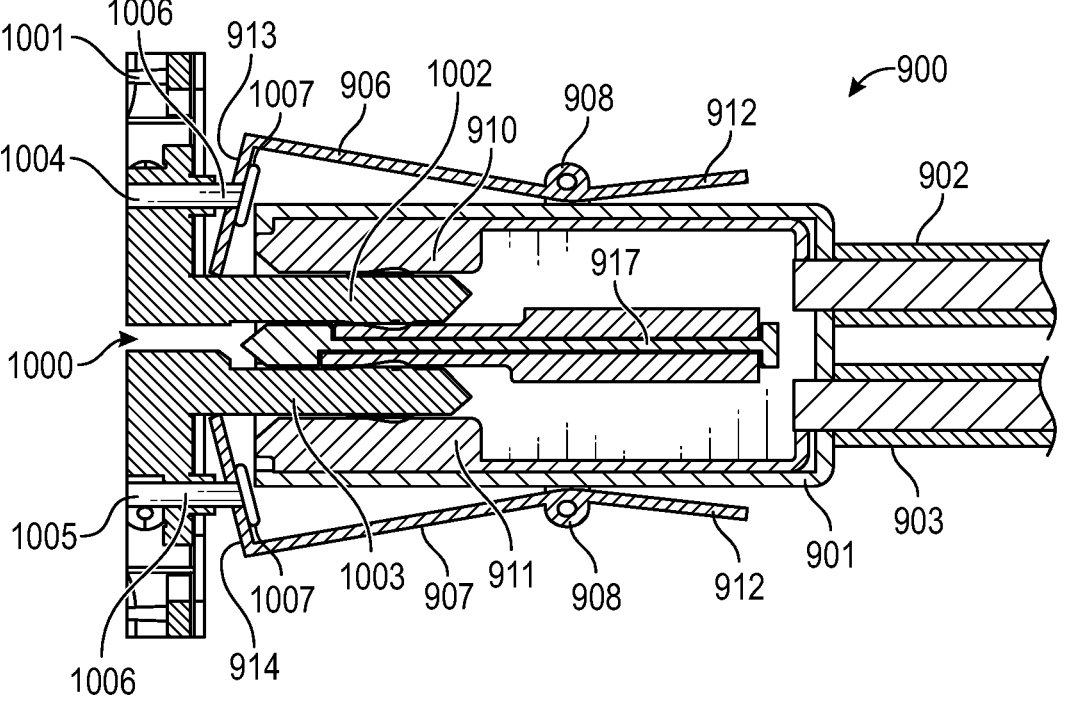

FIG. 10 is a top cross section view of an alternative adapter connected to a busbar clip that is mounted on a server chassis.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

Open Rack v3 (ORV3) server designs rely solely on a rear 48V/54V DC busbar infrastructure that is built into the ORV3 rack. These systems use specially-designed, floating, busbar clips that do not have any inherent latching. In a rack situation, the busbar clip on a server chassis is held in the mated condition with the busbar by the server chassis' ability to latch on to the rack itself. In a bench environment, where server chassis are built, modified, and debugged, there is a need for a reliable, safe, and latched connector to bring power to the server chassis through its floating busbar clip.

The embodiments disclosed herein replicate the design of the busbar contacts inside a custom connector enclosure. By incorporating a hand-operated latching mechanism around the connector's housing, a bench top power connector is provided for an ORV3 server chassis. The latching and holding of the power connector is achieved using the design disclosed herein. The latching mechanism provides user protection from the busbar contacts by covering the connector's opening. A keying mechanism is provided to prevent any reversing of the cable connector polarity.

FIG. 1 is an illustration of a computing rack 100 that includes liquid cooling manifolds 101, 102 and busbar 103, according to embodiments. Computing rack 100 may conform to any appropriate standard or proprietary design and, in particular, may conform to ORV3. FIG. 1 is a rear-facing view of a partially assembled computing rack 100. In some instances, rack 100 includes a frame structure, that may include side panels with rails, brackets, guides, or other components for receiving hardware that is installed in one or more slots 104 of the rack 100. Such hardware may include, for example, a chassis housing one or more of a server, processing unit, memory/storage device, cooling unit, or the like combined to form an Information Handling System (IHS). The frame structure of rack 100 may include a base 105 and a top cover 106 that may be connected via any number of vertical panels, braces, posts, supports, etc.

In the rear-facing view of FIG. 1, the length of busbar 103 is visible as it extends the vertical height of the rack 100, from the base 105 to the top cover 106 in providing a shared supply of power for the hardware components that are installed in the rack 100. Also visible in FIG. 1 is the full length of the liquid cooling manifolds 101, 102 that also extend the vertical height of the rack 100. In the illustrated embodiment, each of the liquid cooling manifolds 101, 102 are attached to the rack 100 via brackets 107. Through the fastening of brackets 107, each of the liquid cooling manifolds 101, 102 is firmly fixed to rack 100. The couplings (not shown) of the liquid cooling manifolds 101, 102 are aligned with rack, and thus with liquid cooling couplings of a chassis or server when installed in a slot of the rack 100. Aligned in this manner, an administrator is able to insert a chassis into the rack 100 and apply force on the chassis until liquid cooling couplings of the chassis are connected with corresponding couplings of the liquid cooling manifolds 101, 102. Similarly, busbar 103 extends the height of computing rack 100 and provides power to each chassis, server, or other IHS component installed in slots on rack 100.

FIG. 2 is a front-view illustration of a server IHS 200 being inserted into a slot of computing rack 100. The server 200 may share resources provided by the rack 100, such as shared cooling and power. Accordingly, insertion of server IHS 200 into a slot of rack 100 couples the liquid cooling couplings 201, 202 on server IHS 200 to liquid cooling manifolds 101, 102, respectively. Power coupling 203 on server IHS 200 is coupled to busbar 103. In a data center environment, server IHS 200 may be installed within a rack 101 along with other similar chassis, such as other server IHSs, that are likewise installed in one or more slots where some or all of these chassis may be similarly coupled to liquid cooling manifolds 101, 102 and busbar 103 provided by the rack 101. Rack 101 includes multiple slots in which a server IHS 200 or similar chassis can be physically inserted by an administrator, where the server IHS 200 is inserted by force applied by an administrator in the direction 204 illustrated in FIG. 2. The sever IHS 200 may be securely locked in place the rack 100 by closing latches 205, which engage with the front edge of rack 100.

When installing server IHS 200 within rack 100, the force applied in direction 204 by the administrator couples the server 200 to shared infrastructure resources of the rack 100. For instance, the server IHS 200 is securely coupled to a busbar 103, which provides the server 200 with a supply of power. The busbar 103 provides a shared power supply used by some or all of the hardware installed in rack 100. Busbar 103 is partially enclosed within shielding 206, which prevents administrators or other users from touching the back or sides of busbar 103 to reduce risk of electrical shock.

In addition, the force applied by the administrator in direction 204 couples the server IHS 200 to liquid cooling manifolds 101, 102 provided by the rack 100. An inlet coolant manifold distributes cooled liquid from a recirculation system (not shown) to server IHS 200, and an outlet coolant manifold receives heated liquid from server IHS 200, which is returned to the recirculation system to be cooled. In the illustrated embodiments, the liquid cooling manifolds 101, 102 may be arranged with either of the manifolds functioning as the inlet manifold and the other as the outlet manifold, with this arrangement selected to correspond to arrangement of liquid cooling couplings 201, 202 of the server IHS 200 and of the other server IHSs or other hardware using the shared liquid cooling resources supported by rack 100. The use of liquid cooling manifolds 101, 102 enables the cooling of multiple servers and/or other hardware by a single cooling source (e.g., the liquid recirculation system).

Through the force applied by the administrator in direction 204, liquid cooling couplings 201, 202 of the server IHS 200 are connected to corresponding couplings 207, 208 of each of the liquid cooling manifolds 101, 102. Once coupled, the liquid cooling couplings 201, 202 are connected to internal inlet and outlet liquid coolant lines in the server IHS 200. In some embodiments, the liquid cooling couplings 201, 202 of the server IHS 200 and the couplings 207, 208 of the liquid cooling manifolds 101, 102 may be quick-connect couplings that can be connected without use of tools and solely via the force applied by the administrator in direction 204. Through the use of such quick-connect couplings, the coupling of server IHS 200 to the liquid cooling manifolds 101, 102 may thus be completed blindly by the administrator that is inserting the server into a slot in the rack 100, while unable to view the liquid cooling couplings 201, 202 that are being connected.

In many instances, racks 100 are constructed according to standardized dimensions that define the vertical and horizontal dimensions of hardware components, such as one or more server IHSs 200, that can be installed within such racks. Standardized rack dimensions specify vertical units of space within a rack, where such vertical units of rack space may be referred to as RUs (Rack Units). In some instances, a server IHS 200 may be one rack unit (1 RU) in height and may house a single IHS. In other instances, an individual sever IHS installed in a rack 100 may be multiple rack units in height and may include multiple IHSs. The chassis may conform to an integer number of rack units, such as 1 OU or RU, 2 OU or RU, or the like. The chassis 200 may be any appropriate size configured to fit within the rack 100. For example, a 2 RU chassis may include a pair of front-facing bays that are each 1 RU in height. In such a chassis, each of the bays may receive a 1 RU IHS that may be separately administered and may be a replaceable component that may be coupled and de-coupled from a chassis. In such instance, the 2 RU chassis may be coupled to liquid cooling manifolds 101, 102 of rack 100 and may provide cooling for the 1 RU IHSs that are installed in the chassis.

Server IHS 200 and other hardware may be installed within one or more slots that are supported by the rack 100, where use of multiple slots may correspond to the server being multiple RUs in height. Through insertion in slots supported by the rack 100, server IHS 200 may be reliably located relative to the rack itself, at least with respect to vertical and horizontal positioning of the server relative to the rack. Such positioning of the server IHS 200 may be supported by various guides and/or other structures that are located along the sides 209 of the outer enclosure of the server. These guides along the sides 209 of the server are received by corresponding rails or other precisely positioned structures along the inner walls of the rack 100.

FIG. 3 is a top view of a server IHS 200 making power and cooling connections while being installed in a rack 100. Cooling manifolds 101, 102 extend vertically along the backside of rack 100. Liquid cooling couplings 201, 202 on server IHS 200 are configured to connect to cooling manifolds 101, 102 via female connectors 207, 208. Although not shown in FIG. 3, it is understood that each of the cooling manifolds 101, 102 may include a set of female connectors 207, 208 for any given rack unit along the height of the rack 100. Furthermore, the particular connectors 201, 202, 207. 208 are for example only, and the scope of implementations may be adapted to use any appropriate liquid cooling connector. In various implementations, the manifold cooling connectors 207, 208 and the server IHS cooling connectors 201, 202 may be either male or female.

Busbar 103 also extends vertically along the backside of rack 100. Busbar 103 is divided horizontally into two electrically isolated halves 103a, 103b that are assigned respective positive and negative, or high-low voltage, polarities for electrical power provided to server IHS 200. Computing racks complying with ORV3 use a DC busbar for power delivery. The typical busbar voltage is 48-54 Vdc and the busbar current can be as high as 3000 A to support 140 KW racks. Power coupling 203 has two sides 203a, 203b corresponding to the polarity of busbar 103. A protrusion or ridge 301 runs vertically along busbar 103 and is configured to fit snuggly between prongs 203a, 203b of power coupling 203 to ensure a tight electrical connection.

The current-carrying capacity of busbar 130 is determined by the maximum temperature at which the bar is permitted to operate, which is typically defined as a maximum temperature rise in standards such as ANSI C37.20 for switchgear assemblies including metal-enclosed bus. As the operating temperature increases, the rate of surface oxidation of the conductor material increases rapidly, which limits the lifetime of the busbar. Accordingly, if the busbar can be cooled, then the busbar will be able to carry more current or safety margins for the busbar can be increased. Cooling busbar 103 will increase the thermal safety margin for rack 100, increase the current-carrying capacity of busbar 103, increase contact reliability with server IHS 200, and will decrease power loss. Convection cooling can be used to transfer heat away from busbar 103. Air cooling of busbar 103 is difficult in environments such as computing rack 100 where server IHS 200 are liquid cooled. Such computing racks require minimal air cooling so that the available airflow through the rack 100 is reduced compared to air-cooled racks. Additionally, protective shielding 206 blocks or reduces airflow near busbar 103 even if the shielding 206 is formed from a perforated or screen material. Liquid cooling of busbars is difficult to achieve due to manufacturing issues and the insulation requirements to prevent energizing the liquid cooling.

In an example embodiment, compressed air may be used to add active cooling to busbar 103. Busbar 103 may comprise a common, off-the-shelf, hollow busbar, which are available in many shapes. Existing hollow busbars are configured with ambient air in the hollow portion. In busbar 103, facility compressed air is connected through an expansion valve or vortex tube. On expansion, the compressed air becomes very cold. The cold, fast-moving air is injected into one end of the busbar 103 cavity, which actively cools the busbar. Waste heat is transferred to the airflow and exhausted out the other end of the busbar 103 cavity.

Server IHS 200 and similar ORV3 designs that require liquid cooling rely heavily on the liquid cooling infrastructure built-in to computing rack 100. These systems use blind-mate liquid cooling couplings and manifolds that do not have any inherent latching. When mounted in rack 100, the liquid cooling fittings 201, 202 on server IHS 200 are held connected to corresponding couplings 207, 208 of the liquid cooling manifolds 101, 102 by latching the server IHS 200 to rack 100, such as by closing latches 205. In a bench or development environment, where server IHSs 200 are built, modified, and debugged, the liquid cooling fittings 201, 202 are not attached to a cooling manifold by locking the server in a rack. Instead, coolant lines are attached directly to liquid cooling fittings 201, 202. Because the blind-mate fittings on a server IHS 200 are designed to slidingly engage the manifold couplings on a rack, the server IHS liquid cooling fittings 201, 202 are not designed to attach to bench coolant lines using screw, latched, or universal quick disconnect type connections. The server IHS cannot operate without liquid cooling in a bench environment. Accordingly, a connection between the server IHS and bench coolant lines that does not impact rack-mounted use is required.

FIG. 4 is a partial top view from the rear of a server chassis 400 that is adapted to fit in a computing rack, such as an ORV3-compatable rack. Server chassis 400 is designed to slide into a slot on the computing rack in direction 401. Server chassis 400 has a pair of male liquid coolant fittings 402 that are adapted to mate with corresponding female liquid coolant couplings in the computing rack. The liquid coolant fittings 402 have a fastener portion 403 that is configured to assist in attachment of the liquid coolant fitting to server chassis 400, such as by providing a hex nut shape for engagement by a wrench or other tool. In other embodiments, the fastener portion 403 may have another shape such as a square nut or a knurled region. The liquid coolant fittings 402 connect with liquid coolant couplings in the computing rack. The server chassis 400 also has a busbar clip 404 for connecting to the busbar in the computing rack.

FIG. 5 is a close-up view of the busbar clip 404 shown on server chassis 400. Busbar clip 404 comprises two blades 501 and 502 having opposite electrical polarities. For a computing rack that provides DC voltage, for example, blade 501 may function as a ground contact having 0 Vdc while blade 502 functions as a power contact having 48/54 Vdc. In other embodiments, blade 501 may be the high power contact while blade 502 is the ground contact. Further embodiments may be adapted for a computing rack that provides AC voltage to the server chassis through busbar clip 404. Because the busbar blades 501, 502 have different polarities, they are electrically isolated from each other and are separated by a gap 503. The computing rack busbar is configured to fit between blades 501 and 502 and to make electrical connections with the blades when the server chassis is fully installed in the rack.

In the illustrated embodiment, a latching rib 504 is formed on the outside surface of each blade 501, 502. While not shown in FIG. 5, the outside surface of blade 502 would also include a latching rib 504. Blade 502 also has a key rib 505 formed on the top surface. In other embodiments, the key rib 505 may be formed on the top surface of blade 501 or on the bottom surface of either blade 501, 502. The latching rib 504 and key rib 505 are placed on blades 501, 502 so as to avoid any degradation or interference with normal busbar connections in an ORV3 computing rack.

FIG. 6 illustrates a busbar cable adapter 600 according to an example embodiment. Adapter 600 has a connector body 601 that is connected to power supply wires 602, 603. In one embodiment, wire 602 is a high-side wire providing 48/54 Vdc while wire 603 is a ground wire having 0 Vdc. In other embodiments, the polarity of the wires 601, 602 may be reversed. Connector body 601 has a key slot 604 that is used to control the polarity match between an adapter 600 and the busbar clip 404. Key slot 604 is configured to receive key rib

505 when adapter 600 is connected to busbar clip 404. Key slot 604 is aligned with high power wire 602, which ensures that wire 602 is connected to blade 502 that has key rib 505. There is no key slot on the bottom of the blades 501, 502. So, if adapter 600 was turned upside down and a user attempted to connect adapter 600 to busbar clip 404, key rib 505 would prevent adapter 600 from connecting to blades 501, 502 because there would be no corresponding slot to receive key rib 505.

Two busbar safety latch covers 605, 606 are attached to connector body 601 by a hinge 607. Latch covers 605, 606 are adapted to pivot around hinges 607. Hinges 607 may be spring-loaded to force latch covers 605, 606 to the closed position as shown in FIG. 6. In the closed position latch covers 605, 606 enclose the front end 608 of connector body 601. This prevents a user from accidentally touching contacts for the busbar clip blades. A user can open the busbar safety latch covers 606, 605 by squeezing the lever portion 609 toward the connector body 601, which will cause the latch covers 606, 605 to pivot around hinges 607.

FIG. 7 is a top cross section view of an adapter 600 connected to a busbar clip 404. To make the connection, a user presses in on levers 609 to open safety latch covers 605, 606 so that latch arms 605a, 606a move away from adapter opening 608. Adapter 600 can then be connected to busbar clip 404. An adapter alignment blade 701 fits between busbar blades 501, 502. Alignment blade 701 is a nonconductive material to maintain isolation between blades 501, 502. When adapter 600 is pushed all the way onto blades 501, 502, the user can release levers 609, which will cause the spring-loaded safety latch covers 605, 606 to move toward the closed position. This movement will force latch arms 605a, 606a to catch behind the latching ribs 504 on each blade 501, 502. With latch arms 605a, 606a behind the latching ribs 504, adapter 600 is held in place until the levers 609 are pressed again to release the adapter 600.

With adapter 600 attached to busbar clip 404, blade 501 touches contact 702 which is coupled by internal circuit path 703 to conductor 603a. Similarly, blade 502 touches contact 704 that is coupled to conductor 602a by circuit path 705. These connections provide the appropriate 48/54 Vdc power to server chassis 400.

FIG. 8 illustrates busbar cable adapter 600 attached to server chassis 400. Key rib 505 on blade 501 of busbar clip 404 fits into key slot 605 to ensure proper alignment and polarity of the adapter 600. Latch covers 605 and 606 are locked on to the latching ribs 504. To remove the adapter 600 from server chassis 400, a user squeezes levers 609 to open latch covers 605, 606, thereby moving latch arms 605a, 606a away from latching ribs 504. With latch arms 605a, 606a away clear of latching ribs 504, adapter 600 can be pulled away from server chassis 400, which will disconnect server chassis 400 from electrical power.

While the illustrated example shows latch arms 605a, 606a locking on to latching ribs 504 to hold adapter 600 in place, it will be understood that in other embodiments alternative methods for attaching the adapter 600 to server chassis 400 may be used. For example, the latch arms 605a, 606a may be adapted to hook on to or to engage other structures on server chassis 400. In one configuration, the latching ribs may be connected to the back surface 801 of server chassis 400 instead of the busbar clip blades. In other configurations, the latch arms 605a, 606a may include hooks that engage openings on the back surface 801, such as holes 802 in the ventilation screen. As long as the latch arms 605a, 606a are connected to the back surface 801, the adapter 600 will remain connected to busbar clip 404.

FIG. 9 illustrates an alternative busbar cable adapter 900 according to an alternative embodiment. Adapter 900 has a connector body 901 that is connected to power supply wires 902, 903. Supply wires 902, 903 may provide any appropriate electrical power for the server chassis that will be connected to adapter 900, such as a DC voltage or an AC voltage having any voltage range or polarity. While only two power supply wires 902, 903 are shown in FIG. 9, it will be understood that in other configurations three or more wires may be connected to the bus adapter with a corresponding number of server-chassis contacts within adapter 900. Connector body 901 has two key slots 904, 905 that are used to control the connected and polarity match between an adapter 900 and a busbar clip on a sever chassis.

Key slots 904, 905 are configured to receive corresponding key ribs when adapter 900 is connected to a busbar clip. Adapter 600 (FIG. 6) had a single key slot 604 that interacted with a single key rib. Key slot 904 would allow adapter 900 to make a connection to busbar clip 404 having the single key rib; however, adapter 600 would not be capable of connecting to a busbar clip with two key ribs as positioned for adapter 900. This would allow different key slot configurations to be used to control which adapters are capable of connecting to different busbar clips, such as to control what adapter power levels are available to different server chassis. Any other modifications to the key slot and corresponding key rib may be designed to control which adapter can connect to a particular busbar clip. Such modifications may include, for example, the number, length, width, and position (i.e., on the top, bottom, and/or sides on the adapter/busbar clip) of the slot(s). Additionally, while the key slot is shown as an open space through the wall of connector body 901, in other embodiments the key slot may be a groove on the interior or exterior surface of the connector body that does not penetrate all the way through the sidewall of the connector body. Correspondingly shaped key ribs may be selected to mate with the key slot groove.

Two busbar safety latch covers 906, 907 are attached to connector body 901 by a hinge 908. Latch covers 906, 907 are adapted to pivot around hinges 907. Hinges 907 may be spring-loaded to force latch covers 906, 907 to the closed position. In the closed position, latch covers 906, 907 enclose the front end 909 of connector body 901. This prevents a user from accidentally touching contacts 910, 911 for the busbar clip blades. A user can open the busbar safety latch covers 906, 907 by squeezing the lever portion 912 toward the connector body 901, which will cause the latch covers 906, 907 to pivot around hinges 907. It will be understood that other arrangements may be used to connect latch covers 906, 907 to connector body 901. For example, hinges 908 may be positioned in a different location or a sliding or rotating connection may be used between latch covers 906, 907 and connector body 901.

The latch covers 906, 907 each include a latch arm portion 913, 914. The latch arms 913, 914 each have a slot 915, 916 that allows for a different type of attachment to the busbar clip compared to adapter 600. The slots 915, 916 are configured to engage pins on the server chassis itself or on a busbar clip. The slots 915, 916 allow adapter 900 to secure latch on to the corresponding pins and to hold adapter 900 in place against the busbar clip.

FIG. 10 is a top cross section view of an adapter 900 connected to a busbar clip 1000 that is mounted on a server chassis 1001. Busbar clip 1000 has connection blades 1002, 1003. To make the connection, a user presses in on levers 912 to open latch covers 906, 907 so that latch arms 913, 914 move away from adapter opening 909. Adapter 900 can then be connected to busbar clip 1000. An adapter alignment blade 917 fits between busbar blades 1002, 1003. Alignment blade 917 is a nonconductive material to maintain isolation between blades 1001, 1002. When adapter 900 is pushed all the way onto blades 1001, 1002, the user can release levers 909, which will cause the spring-loaded safety latch covers 906, 907 to move toward the closed position. This movement will cause slots 915, 916 on latch arms 913, 914 to engage pins 1004, 1005 on busbar clip 1000. With latch arms 913, 914 engaged behind the pins 1004, 1005, adapter 900 is held in place until a user presses levers 909 inward to release latches 906, 907.

With adapter 900 attached to busbar clip 1000, blade 1002 touches contact 910, which is coupled by an internal circuit path to power supply wire 902. Similarly, blade 1003 touches contact 911, which is coupled to power supply wire 903 by internal circuitry. These connections provide the appropriate power voltage and polarity to server chassis 1001.

Adapter 900 does not require latching ribs on busbar clip 1000. Instead pins 1004, 1005 are used to engage latching arms 913, 914. Pins 1004, 1005 have a neck portion 1006 and a head portion 1007. The neck portion is sized to fit within slots 915, 916, and head portion 1007 is sized to prevent latching arms 913, 914 from sliding off of pins 1004, 1005. Head portion 1007 may have any appropriate size, shape, or orientation to keep latching arms 913, 914 on pins 1004, 1005. In other configurations, instead of engaging a head portion 1007, pins 1006 may have a groove or other recessed portion that engages slots 915, 916. Pins 1004, 1005 may be any pin, post, tab, screw, rivet or other protrusion that can be engaged by slots 915, 916. Pins 1004, 1005 may be an existing structural component or other feature of server chassis 1001, such as a screw or rivet, or may be an added component that is specifically included to provide use with adapter 900.

In one arrangement, a cable adapter for a server chassis comprises an adapter body having a first surface with a key slot. The key slot is configured to interface with and/or receive a key rib on a busbar clip of the server chassis. A pair of latches are pivotally attached to opposite sides of the adapter body. The latches configured to move between an open position and a closed position. Each latch has a latch arm extending across an open end of the adapter body when in the closed position. The pair of latches may be spring-loaded to the closed position. The latch arms are configured to engage a feature of the server chassis. A pair of connectors are positioned inside the adapter body and are exposed at the open end when the latches are in the open position. The connectors are configured to engage blades of the busbar clip.

The feature of the server chassis that is engaged by the latch arms may be one or more latching ribs on the blades of the busbar clip. The latch arms may be configured to hook around the latching ribs.

The feature of the server chassis that is engaged by the latch arms may be one or more holes in a back surface of the server chassis. The latch arms may be configured to hook on to the one or more holes.

The key rib may be located on a first blade of the busbar clip. The key rib may be located on a top surface of the first blade of the busbar clip. The first blade may be a high side voltage or positive polarity blade.

The cable adapter further includes a first contact and a second contact in the adapter body. The first contact is configured to make an electrical connection to a first blade of the busbar clip when the cable adapter is connected to the server chassis. The second contact is configured to make an electrical connection to a second blade of the busbar clip when the cable adapter is connected to the server chassis. The first contact and the second contact are covered by the latch arms when the pair of latches are in the closed position.

In another arrangement, a server chassis comprises a busbar clip that is adapted to connect to a busbar on a computing rack. The busbar clip comprises a first electrical contact and a second electrical contact. A key rib is located on the first electrical contact. The key rib is configured to fit within a key slot of a cable adapter. One or more latching ribs are formed on or attached to the first electrical contact or the second electrical contact or on both. The latching ribs are configured to engage latch arms of a cable adapter so that the cable adapter is held connected to the first electrical contact and the second electrical contact.

The key rib may be located on a top surface of the first electrical contact or on a high side voltage or positive polarity electrical contact.

The cable adapter is coupled to the busbar clip. The cable adapter comprises a pair of latches that are pivotally attached to opposite sides of the adapter body. The latches are configured to move between an open position and a closed position. Each latch has a latch arm that is engaged with the one or more latching ribs. A pair of connectors are located inside the adapter body. The connectors are configured to engage the first electrical contact and the second electrical contact. The pair of latches are spring-loaded to a closed position.

In a further embodiment, a method for providing power to a server chassis comprises opening latching arms on a cable adapter to expose a pair of electrical contacts within the cable adapter, coupling the pair of electrical contacts to a pair of busbar blades on the server chassis, engaging a key rib on one busbar blade with a key slot on the cable adapter, and closing the latching arms around one or more latching ribs on the busbar blades. The latching arms are spring-loaded to a closed position. When the latching arms are closed around the one or more latching ribs, the cable adapter cannot be removed from the pair of busbar blades without opening the latching arms. The key rib is located on a top surface of the one busbar blade, and the key slot is located on a top surface of the cable adapter. The key slot and key rib are configured to ensure a polarity match between the pair of electrical contacts and the pair of busbar blades. The method further comprises providing electrical power to the server chassis when not installed in a rack via wires attached to the cable adapter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

What is claimed is:

1. A cable adapter for a server chassis, comprising:

an adapter body having a first surface with a key slot, the key slot configured to receive a key rib on a busbar clip of the server chassis;

a pair of latches pivotably attached to opposite sides of the adapter body, the latches configured to move between an open position and a closed position, each latch having a latch arm extending across an open end of the adapter body when in the closed position, the latch arms configured to engage a feature of the server chassis; and a pair of connectors inside the adapter body and exposed at the open end when the latches are in the open position, the connectors configured to engage blades of the busbar clip.

2. The cable adapter of claim 1, wherein the feature of the server chassis is one or more latching ribs on the blades of the busbar clip, and wherein the latch arms are configured to hook around the latching ribs.

3. The cable adapter of claim 1, wherein the feature of the server chassis is one or more holes in a back surface of the server chassis, and wherein the latch arms are configured to hook on to the one or more holes.

4. The cable adapter of claim 1, wherein the key rib is located on a first blade of the busbar clip.

5. The cable adapter of claim 4, wherein the key rib is located on a top surface of the first blade of the busbar clip.

6. The cable adapter of claim 4, wherein the first blade is a high side voltage or positive polarity blade.

7. The cable adapter of claim 1, wherein the pair of latches are spring-loaded to the closed position.

8. The cable adapter of claim 1, further comprising:

a first contact in the adapter body, the first contact configured to make an electrical connection to a first blade of the busbar clip when the cable adapter is connected to the server chassis; and a second contact in the adapter body, the second contact configured to make an electrical connection to a second blade of the busbar clip when the cable adapter is connected to the server chassis;

wherein the first contact and the second contact are covered by the latch arms when the pair of latches are in the closed position.

9. A server chassis, comprising:

a busbar clip adapted to connect to a computing rack busbar, the busbar clip comprising:

a first electrical contact and a second electrical contact;

a key rib on the first electrical contact, the key rib configured to fit within a key slot of a cable adapter; and one or more latching ribs on the first electrical contact or the second electrical contact or on both, the latching ribs configured to engage latch arms of a cable adapter so that the cable adapter is held connected to the first electrical contact and the second electrical contact.

10. The server chassis of claim 9, wherein the key rib is located on a top surface of the first electrical contact.

11. The server chassis of claim 9, wherein the key rib is located on a high side voltage or positive polarity electrical contact.

12. The server chassis of claim 9, further comprising:

the cable adapter coupled to the busbar clip, the cable adapter comprising:

an adapter body having a first surface with the key slot;

a pair of latches pivotably attached to opposite sides of the adapter body, the latches configured to move between an open position and a closed position, each latch having a latch arm that is engaged with the one or more latching ribs; and a pair of connectors inside the adapter body, the connectors configured to engage the first electrical contact and the second electrical contact.

13. The server chassis of claim 12, wherein the pair of latches are spring-loaded to a closed position.

14. A method for providing power to a server chassis, comprising:

opening latching arms on a cable adapter to expose a pair of electrical contacts within the cable adapter;

coupling the pair of electrical contacts to a pair of busbar blades on the server chassis;

engaging a key rib on one busbar blade with a key slot on the cable adapter; and closing the latching arms around one or more latching ribs on the busbar blades.

15. The method of claim 14, wherein the latching arms are spring-loaded to a closed position.

16. The method of claim 15, wherein when the latching arms are closed around the one or more latching ribs, the cable adapter cannot be removed from the pair of busbar blades without opening the latching arms.

17. The method of claim 14, wherein the key rib is located on a top surface of the one busbar blade, and wherein the key slot is located on a top surface of the cable adapter.

18. The method of claim 14, wherein the key slot and key rib are configured to ensure a polarity match between the pair of electrical contacts and the pair of busbar blades.

19. The method of claim 14, further comprising:

providing electrical power to the server chassis when not installed in a rack via wires attached to the cable adapter.

* * * * *